United States Patent [19]

Auracher et al.

[11] Patent Number: 4,548,464

[45] Date of Patent: Oct. 22, 1985

[54] FREQUENCY ANALYZER IN PLANAR WAVEGUIDE TECHNOLOGY AND METHOD OF MANUFACTURE

[75] Inventors: Franz Auracher, Baierbrunn; Michael Stockmann, Munich, both of Fed. Rep. of Germany

[73] Assignee: Siemens Aktiengesellschaft, Berlin & Munich, Fed. Rep. of Germany

[21] Appl. No.: 409,625

[22] Filed: Aug. 19, 1982

[30] Foreign Application Priority Data

Sep. 29, 1981 [DE] Fed. Rep. of Germany ....... 3138727

[51] Int. Cl.$^4$ .............................................. G02B 5/14
[52] U.S. Cl. .................. 350/96.14; 350/96.13; 350/96.12
[58] Field of Search ............... 350/96.12, 96.13, 96.14, 350/96.34, 355

[56] References Cited

U.S. PATENT DOCUMENTS 4,403,825 9/1983 Tangonan et al. ................ 350/96.12

OTHER PUBLICATIONS

Barnoski et al., "Integrated Optic Spectrum Analyzer", *IEEE Transactions on Circuits and Systems*, vol. CAS-26, No. 12, Dec. 1979, pp. 1113-1124.
Chen et al., "Diffraction-Limited Geodesic Lens for Integrated Optic Circuit", *IEEE Journal of Quantum Electronics*, vol. QE-15, No. 9, Sep. 1979, pp. 853-860.
Mergerian et al., "Diamond-Turned Aspheric Geodesic Waveguide Lenses in Lithium Niobate", *Integrated Guided-Wave Optics Technical Digest*, Incline Village, NV, USA, 1980, ME4-1 to ME4-4.
Yao et al., "Chirp-grating Lens for Guided-Wave Optics", *Applied Physics Letters*, vol. 33, (1978), pp. 635-637.
Boyd et al., "Optical Channel Waveguide Arrays Coupled to Integrated Charge-Coupled Devices and Their Applications", *SPIE, Guided Wave Optical Systems and Devices II*, vol. 176, (1979), pp. 141-147.

*Primary Examiner*—William L. Sikes
*Assistant Examiner*—Robert E. Wise
*Attorney, Agent, or Firm*—Hill, Van Santen, Steadman & Simpson

[57] ABSTRACT

A frequency analyzer, which is manufactured in a planar waveguide technology has a first substrate provided with a waveguide modulator for modulating light travelling in the waveguide connected to a lens for the Fourier transformation of the modulated light. The material of the lens is different than the material of the substrate having the modulator and preferably is either a rod shaped gradient lens or a second substrate, which as a geodesic waveguide lens pressed into the surface.

15 Claims, 12 Drawing Figures

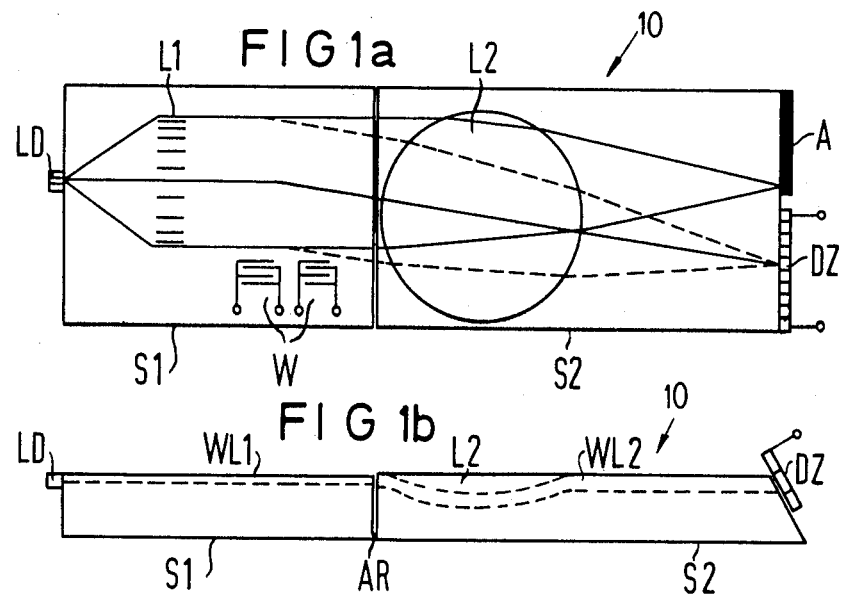
FIG 1a
FIG 1b
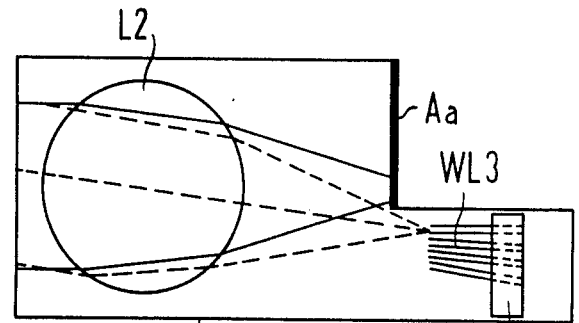
FIG 2a
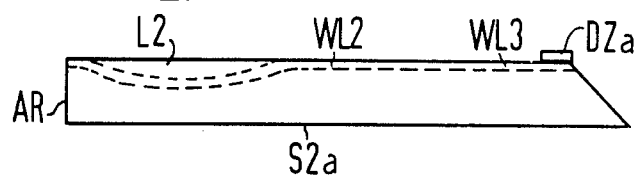
FIG 2b

FREQUENCY ANALYZER IN PLANAR WAVEGUIDE TECHNOLOGY AND METHOD OF MANUFACTURE

BACKGROUND OF THE INVENTION

The present invention is directed to a frequency analyzer in a planar waveguide technology which analyzer has a modulator-optical part having at least one planar waveguide modulator for modulating light travelling in a planar waveguide on a substrate and a lens optical part which is disposed in a position following the modulator part and including at least one lens for forming a Fourier transformation of the modulated light such as a geodesic lens on a substrate. The invention also is directed to a method of manufacturing a planar, geodesic lens on a substrate.

Acousto-optical frequency analyzers can be utilized for the frequency analysis of high frequency signals. These analyzers enable a frequency analysis in "real time" in a simple manner. The employment of an acousto-optical frequency analyzer in planar waveguide technology is of particular interest and is discussed by M. K. Barnoski et al. "Integrated Optic Spectrum Analyzer" IEEE Transactions on Circuits and Systems, Vol. CAS-26 No. 12, December 1979, pp. 1113–1124. Because of its compact structure, this technology offers the advantage of mechanical stability which is extremely important in devices for optically coherent signal processing. Moreover the planar format allows the employment of cost favorable manufacturing methods such as for example using photolithography.

Herebefore, the most frequently utilized manner of realizing a planar frequency analyzer provides a substrate of a monocrystalline $LiNbO_3$ and an optical waveguide is formed in the substrate by diffusion of Ti therein. The light, which is from a source such as a gas laser or a semi-conductor laser, is coupled into the waveguide at one end face and after travelling along the waveguide strikes a photo detector row, which is coupled to the opposite end face of the waveguide. The waveguide modulator of the modulator optical part comprises an electro-acoustical transducer, which can be photolithographically applied to the substrate and which serves to generate a surface acoustical wave. The lens optical art, which preferably comprises a geodesic lens for the Fourier transformation, is positioned on the substrate in a position following the waveguide modulator. In addition, a geodesic lens for the collimation of light from the light source is also preferably supplied before the modulator i.e. between the modulator and the light source. The lenses can be produced in the substrate by means of ultrasonic erosion or with a diamond turning or milling method. Both these methods are known and examples are discussed by B. Chen, et al. "Diffraction-Limited Geodesic Lens for Integrated Optic Circuit," IEEE Journal of Quantum Electronics, Vol. QE-15, NO. 9 (1979), pp. 853–860 and D. Mergerian et al., "Diamond-Turned Aspheric Geodesic Waveguide Lenses in Lithium Niobate," Integrated Guided-Wave Optics Technical Digest, Incline Village, Nev., U.S.A., 1980, ME4.

There are still numerous problems in the manufacture of these lenses. In principal, a plurality of lenses can be manufactured in the ultrasonic erosion method with a high-precision manufactured tool. However, the wear of the tool proved to be too high in order to be able to reproducably manufacture a geodesic structure. In contrast thereto, the diamond turning or milling method seems to supply reproducable results but each lens must be individually manufactured with the same cost and must also be manually burnished or polished. Thus, the production of these lenses by the diamond turning method is an expensive procedure.

SUMMARY OF THE INVENTION

The present invention is directed to providing an acousto-optical frequency analyzer in a planar waveguide technology whose structure can be manufactured in a very cost favorable manner and to the method of manufacturing the analyzer.

These objects can be obtained in an improvement of a frequency analyzer for planar waveguide technology having a modulator-optical part with at least one planar waveguide of a substrate and a lens optical part being disposed in a position following the modulator including at least one lens for creating a Fourier transformation of the modulated light. The improvement is that different materials are utilized for the substrate of the modulator part and for the lens optical part. The lens optical part can be constructed of a material in which a gradient lens is formed, which will have the form of a rod. However, the lens optical part can also comprise a substrate which has at least one geodesic lens for creating the Fourier transformation and is preferably of a material which can have the geodesic lens produced by means of being pressed into the surface of the substrate by a die which may be a hot pressing procedure.

Suitable materials for being hot pressed are selected from a group consisting of glass and synthetic plastics. Also glass or synthetic plastics can be used for providing the rod shaped gradient lens embodiment.

Substrate material for the modulator-optical part preferably consists of a $LiNbO_3$ substrate whose material properties guarantee an optimum acousto-optical interaction and thus enable favorable employment of the electro-acoustical transducer as the waveguide modulator. The electro-acoustical transducer is always constructed as an interdigital electrode structure in broad-band execution of as an arrangement of a plurality of interdigital electrode structure in broad-band execution or as an arrangement of a plurality of narrow band transducers.

By utilizing different materials for the different substrates or for the substrate and the gradient lens, they can be connected to each other by means of a butt joint. To avoid the Fresnel reflections, it is desirable to provide an anti-reflection layer between the butt coupled parts forming the butt joint.

In one embodiment, it is desirable to utilize a third substrate, which is of a different material than the substrate material of the modulator-optical part and which has a geodesic lens formed therein to provide a collimation of the light from the light source prior to reaching the waveguide modulator. This third substrate having the collimation lens can be formed of the same material as the substrate having the Fourier transformation lens and these substrates allow simple manufacture of the lens as well as the total frequency analyzer.

Another particularly advantageous structure of the invention is constructed in such a manner that the geodesic lens for the Fourier transformation serves simultaneously a plurality of waveguide modulators of the modulator-optical parts which are distributed over the circumference of the lens which acts as a common lens for the Fourier transformation. This common lens accordingly is expediently formed on a polygonal shaped substrate having a lateral surface with a plurality substrate each with a waveguide modulator and also a plurality at detector elements being connected to the edges.

The structure of the frequency analyzer with a single lens being used for a number of modulators is to be viewed in general as an advantageous structure of frequency analyzers which can also be realized in other technologies.

As mentioned hereinabove the particular simple and expedient method for the manufacture of the geodesic lens on or in a substrate which is particularly suited for a low cost manufacturer of the inventive frequency analyzer is by impressing or stamping the substrate consisting of a suitable material with a die having a negative of the desired shape of the lens. Preferably this is done with a hot pressing method and can be done either prior to forming the planar waveguide on the substrate or after the waveguide has been formed on the substrate. The die with a negative shape of the structure of the lens can be manufactured by utilizing a numerical controlled lathe.

The planar waveguide can be produced in a multitude of different ways, for example, it can be produced on the impressed surface either by means of depositing of one or a plurality of layers or by means of introducing doping materials under the impressed surface by means of an ion implantation or ion exchange or diffusion process.

BRIEF DESCRIPTIONS OF THE DRAWINGS

FIG. 1a is a plan view of a frequency analyzer in accordance with the present invention;

FIG. 1b is a side view of the analyzer of FIG. 1a;

FIG. 2a is a plan view of a modification of a lens optical part of the frequency analyzer of FIG. 1a;

FIG. 2b is a side view of the modification of FIG. 2a;

FIG. 3b is a side view of the analyzer of FIG. 3a;

FIG. 5b is a plan view of the device of FIG. 5a;

FIG. 6 is a side view of another modification for in-coupling device similar to FIG. 5a;

DESCRIPTION OF THE PREFERRED EMBODIMENT

Figure 3A:
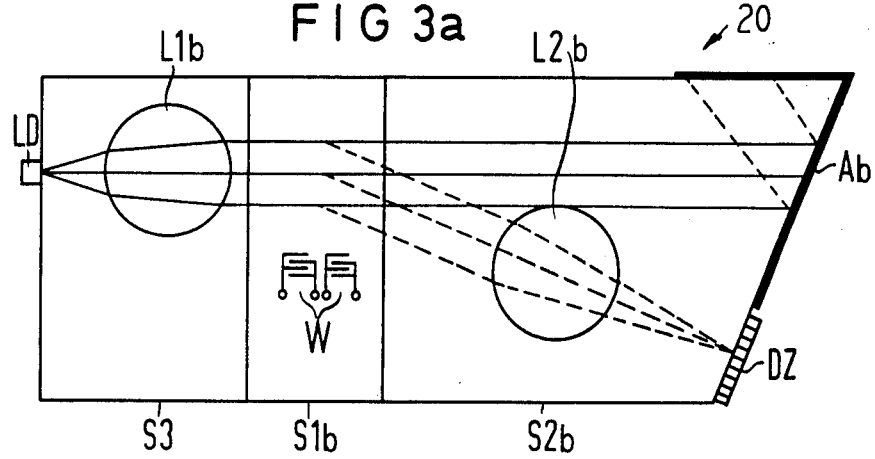
FIG. 3a is a plan view of another embodiment of the frequency analyzer in accordance with the present invention.

The principles of the present invention are particularly useful when incorporated in a frequency analyzer generally indicated in 10 in FIGS. 1a and 1b. The frequency analyzer 10 consists of two substrates S1 and S2 which are of different materials and are butt coupled together. The substrate S1 essentially carries the modulator-optical part and consists of $LiNbO_3$ into which a planar or layer waveguide WL1 is formed by Ti being diffused into the surface of the substrate. The electrode structure of an electro-acoustical transducer W and the structure of a Braggs lens L1 are photolithographically applied on to the surface of the substrate S1. It is noted that Braggs lens are known and disclosed in an article by S. K. Yao et al. "Chirp-grating Lens for Guided-Wave Optics," *Applied Physics Letters* Vol. 33 (1978), pp. 635-637. The lens L1 acts for this collimation of the light from a light source such as a laser diode LD, which is coupled into the waveguide WL1 over its end surface or face. The Braggs lens is well suited as a lens L1 and can be likewise manufactured in a planar process. The high angle selectivity of the Braggs lens does not appear in the collimation but would be a disadvantage in the lens L2 for the Fourier transformation. For this reason, the lens L2 for the Fourier transformation is designed as a geodesic lens. The lens L2 is formed on the substrate S2, which consists of material in which the lens structure can be impressed.

The lens L2 is manufactured by a very cost favorable manner or method such as follows; a die with a negative shape of the geodesic structure, which would, for example, consist of a circular, trough-shape depression, is manufactured with a numerically controlled lathe. As many substrates as desired can be provided with lens structure with the die in a hot-pressing method. A suitable substrate material is selected from either glass or synthetic plastics and suitable glasses are already under development.

The required waveguide WL2 on the substrate S2 can be produced in many different ways. For example, after producing the structure of the lens L2 the waveguide can be formed by means of applying one or more suitable layers on to the surface of the substrate to provide this structure. It also can be produced by means of introducing doping material under the surfaces of substrate for example by means of an ion implantation or by a diffusion process. The waveguide WL2 can also be produced before the creation or generation of the structure of the lens L2.

The waveguide WL2 will usually exhibit a low attenuation and scattering value when compared to a waveguide such as WL1 which is formed in the $LiNbO_3$ substrate. The coupling of the two waveguides WL1 and WL2 is not critical because of the waveguide WL2 can be a thicker or deeper waveguide than the waveguide WL1. The possibility that the thicker or deeper waveguide WL2 will conduct more than one light wave is of no consequence because the refractive power of the geodesic lens L2 is independent of the wave mode.

In order to avoid Fresnel reflections at the coupling location of the two waveguides, an anti-reflection layer AR (FIG. 1b) is applied to one of the two end faces of the two waveguides WL1 and WL2 or respectively to one of the waveguide WL2 or respectively the substrate S2 facing way from the waveguide WL1 or respectively the substrate S1, a detector row DZ and a light absorber A are provided. The absorber A is for the undiffracted light. The detector row DZ is a type, which, for example, has a particularly low detector spacing in order to exploit the frequency resolution of the Bragg cell.

A modification of the substrate having the lens optical part is illustrated by substrate S2a in FIGS. 2a and 2b. A frequency analyzer utilizing substrate S2a can use a conventional detector row DZa. This is because a relative large detector spacings of the standard detector are matched by a fan-shape strip waveguide conductor structure WL3 to the smaller spacing of the various frequency channels in the focal plane of the lens L2 for the Fourier transformation. This is disclosed by J. T. Boyd, et al., "Optical Channel Waveguide Arrays Coupled to Integrated Charge-Coupled Devices and Their Applications," *SPIE, Guided Wave Optical Systems and Devices II* Vol. 176 (1979), pp. 141-147. In this case, light from the strip waveguide can be easily coupled into a bonded-on detector array DZa by a leakage wave coupling wherein the disruptive reflections are also voided. Alignment is also easier in this case than that when the detector array is attached to an end face of the substrate. In contrast thereto, a leakage wave coupling is not possible when utilizing an LiNbO3 substrate because the index of refraction of such a substrate is greater than all known adhesives. Thus the advantage of using leakage wave coupling is possible because of the use of different substrate materials. It's also noted, that the light absorber Aa is placed in a cut-out portion of the substrate S2a.

Figure 3B:
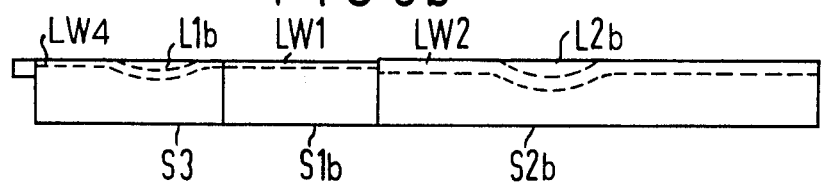

An embodiment of the analyzer is generally indicated at 20 in FIGS. 3a and 3b and utilizes three different substrates. Since the geodesic lens structure as described hereinabove is very easy to manufacture, the lens L1 for collimating of light coming from a laser diode or from a laser LD can be a lens such as L2 for Fourier transformation and be manufactured practically without any additional outlay as a geodesic lens. Thus, the size of the substrate, which carries the optical modulator and is an LiNbO3 substrate, is reduced to the size of substrate S1b in FIGS. 3a and 3b. A collimation lens L1b is formed on a glass substrate S3. This substrate is also provided with a waveguide LW4. The necessary butt or coupling location between the waveguide LW4 on the substrate S3 for the lens L1b and the waveguide LW1 on the substrate S1b with the transducer W, however, only leads to tolerable losses when the waveguide LW4 on the glass substrate is just as flat as the waveguide LW1.

The dynamic range and frequency resolution of the planar frequency analyzer are essentially limited by light scatter which occurs in the waveguide. In this consideration, glass waveguides are superior to waveguides formed in a LiNbO3 substrate, the focal length of the lens must be selected relatively short because the LiNbO3 crystals only with approximately 75 mm diameters are available and also because the light scatter or respectively optical attenuation as well result in too low a dynamic for the frequency analyzer in the long waveguides. In glass, waveguides can be properly manufactured with better optical properties than in an LiNbO3 substrate. For example, it can be manufactured by means of a vapor deposition of a layer onto the glass substrate or by means of either ion implantation or ion exchange. In addition, available glass substrates are larger and cheaper. As a result a greater focal length can be selected for the lens L2b for the Fourier transformation. This result in the fact that for a given frequency resolution, a detector array DZ with a conventional detector spacing can be utilized on the glass substrate. If a detector array with a spacing that is required for an LiNbO3 frequency analyzer is used on the glass substrate, a higher frequency resolution can be achieved.

The substrate sizes of glass substrates also allow the manufacturer of a multitude of lens with only one end face working. Also deriving from the greater overall length, a possibility exists in selecting the spacing of the lens L2b for the Fourier transformation from a Bragg lens on the substrate S1 so large that the undiffracted light passes by lens L2b and is entirely received by the light absorber Ab on the substrate S2b. This results in a further reduction of the light scatter at the detector array DZ because the lens, as a scatter center, no longer influence the intensive undiffracted light.

Waveguides, which are formed by Ti diffusion into a substrate of LiNbO3, can be destroyed as a result of too high a power densities of the guided light. This effect predominantly occurs at the location of the waveguide, where the light is focused namely because of the extremely high powered densities at such locations. The final result is a reduction of the frequency resolution of the frequency analyzer. This problem is avoided when a glass waveguide in which no optical damage can occur is employed at the location of laser diode LD and/or at the detector diode DZ. The embodiment of the analyzer 20 meets these conditions.

Figure 4:
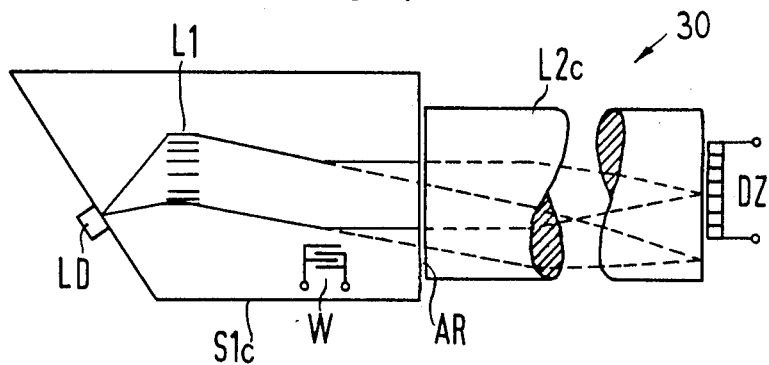
FIG. 4 is a plan view of another embodiment of a frequency analyzer in accordance with the present invention.

Another embodiment of the analyzer is generally indicated at 30 in FIG. 4. This embodiment, like the embodiment 10 of FIG. 1, consists of a substrate S1c which is similar to the substrate S1 of FIG. 1 except for the end face being on an angle. The substrate S1c has a laser diode LD on the end face surface, Bragg lens L1 and an acoustical transducer W, which correspond basically to the same elements on the substrate S1 of FIG. 1. However, instead of a glass substrate S2 with a geodesic lens L2 as in FIG. 1, this embodiment 30 replaces the substrate S2 with a rod shaped gradient lens L2c. An anti-reflection layer AR is also provided between the joint of the lens L2c and the substrate S1c to avoid light losses, which will occur due to the reflection at the refractive index discontinuity of the LiNbO3 to glass boundary surface. A conventional detector array DZ is mounted on the end face of the gradient lens L2c, which end face faces away from the substrate S1c.

Figure 5A:
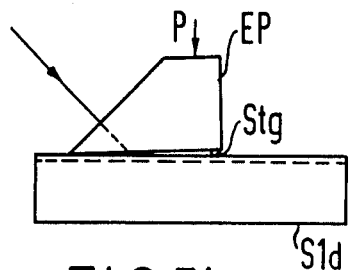
FIG. 5a is a side view of an in-coupling device for coupling light into the planar waveguide modulator by utilizing a prism.
Figure 5B:
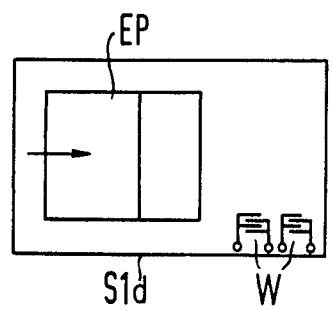
Figure 6:
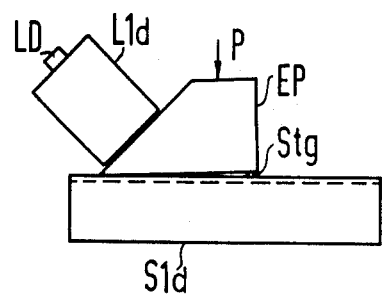

In all the previous examples, the light of the laser diode LD was coupled into the waveguide such as WL1 at an end face. However, the light can also be coupled into the waveguide utilizing a prism coupling. Two embodiments of this arrangement are illustrated in FIGS. 5a, 5b and also FIG. 6. FIGS. 5a and 5b shows an arrangement for incoupling collimated light from an external source for example a gas laser. By utilizing a prism EP disposed above or on the waveguide, which is formed on the substrate S1d. In the embodiment illustrated in FIG. 6, the light is again emitted by a laser diode LD and is collimated by a gradient lens L1d before it enters into the coupling prism EP. The laser diode LD, a gradient lens L1d and an incoupling prism EP are glued to one another and form a compact unit. In both examples, the incoupling prism EP is pressed with a mechanical pressure P against the waveguide on the substrate S1d. In order to improve the efficiency of the prism coupling, the prism base and the substrate surface form a wedge shaped air gap. This is achieved with a thin ridge Stg which is vapor deposit on the substrate S1d. In both instances, the arrangement with the incoupling prism EP replaces the waveguide lens such as the Bragg lens of the device 10 or the geodesic waveguide lens in the device 20 which are used for collimation of the light.

Figure 7:
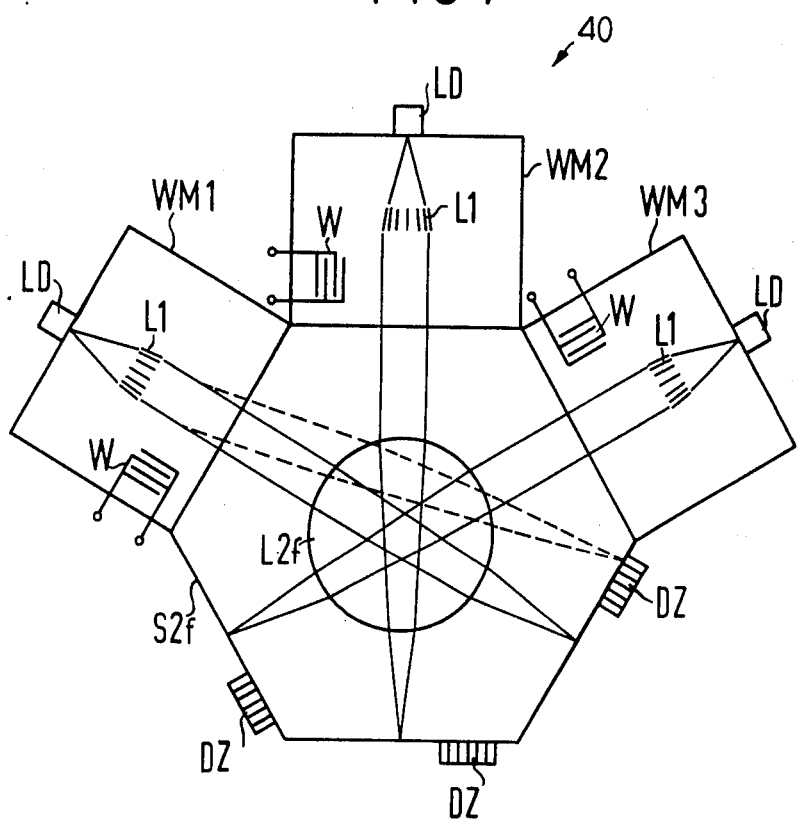
FIG. 7 is a plan view of embodiment of the frequency analyzer with a plurality of waveguide modulator's having a common lens for the Fourier transformation.
Figure 8:
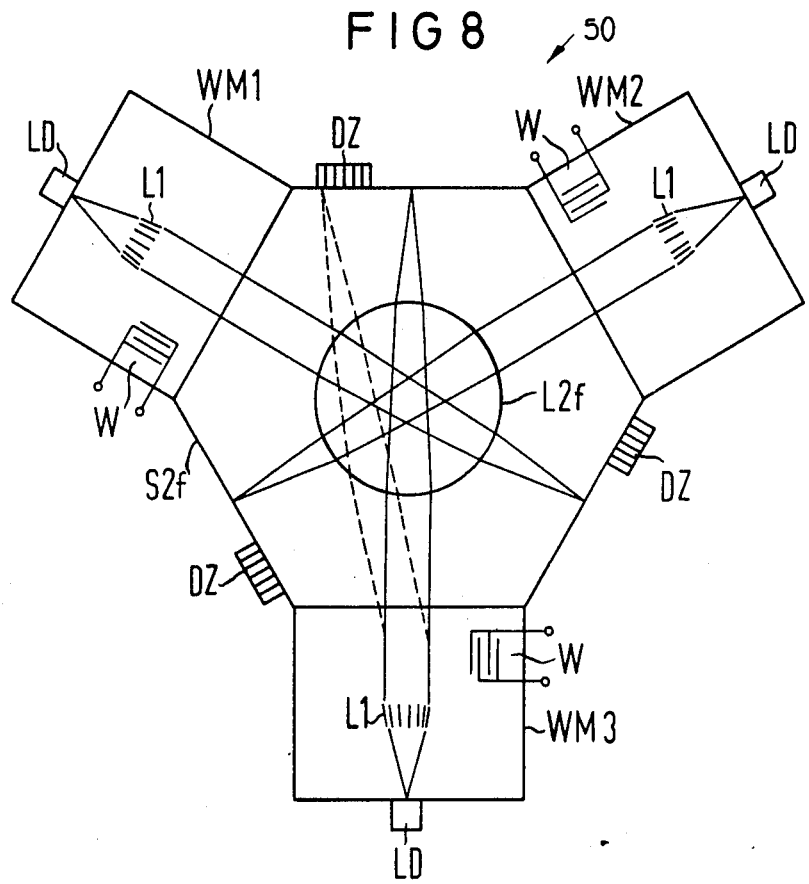
FIG. 8 is plan view of another embodiment of a frequency analyzer with a plurality of waveguide modulators having a common lens for the Fourier transformation.

Two additional embodiments of the device are generally indicated at 40 in FIG. 7 and 50 in FIG. 8. In each of these embodiments, light is modulated by a plurality of independent waveguide modulators, which are electro-acoustical transducer and the modulated beam then traverse the same lens L2f for the Fourier transformation.

The central component of both the device 40 and the device 50 is a waveguide lens L2f in the center of a substrate S2f, which has the form of a regular polygon with an even number of edges. All rotationally symmetric types come in to consideration for the waveguide lens L2f such as for example the geodesic lens or a Luneberg lens. The task of the waveguide lens L2f is to focus the parallel light coming from a plurality of waveguide modulators WM1, WM2, and WM3 and thus serves for a Fourier transformation of the high frequency signals. The waveguide modulators WM1, WM2 WM3 can be, for example, electro-acoustical transducer W. The substrate with the electro-acoustical transducers are butt coupled to the edges or respectively sides of the polygon substrate S2f with the lens L2f. Lens L1 for the collimation of the light emitted the particular laser diode LD of the unit can also be disposed on the substrate of the modulator. However, all modifications already proposed above are also possible. It should also be noted that with regard to coupling of the detector rows DZ to the edges of respectively sides of substrate S2f, they are disposed on a side that is opposite to each waveguide modulator. In the device or embodiment of the analyzer 40 of FIG. 7, adjacent waveguide modulators are coupled to adjacent sides of the polygon forming the substrate S2f. The embodiment of the analyzer 50 of FIG. 8 differs from the embodiment of 40 because adjacent waveguide modulators are coupled to sides of the polygon substrate S2f which are separate from one another by a side of the polygon. In the device 50 an enlargement of the dynamic range is therefore achieved. The detector arrays or rows DZ are only struck by the back scatter light components of adjacent frequency analyzers whereas in the device 40, they also receive forwardly scattered components of adjacent analyzers. The back scattered light components are generally of a lower intensity than the forward scattered component.

The manufacturing of the lens L2 for the Fourier transformation is currently the most involved work step in the manufacturing of the integrated optical frequency analyzer such as the device 10. As a result of the multiple exploitation of the lens L2 for the Fourier transformation, the structure of the device 40 of FIG. 7 and 50 of FIG. 8 accordingly simplifies the manufacturing of the system of modulators which are operated in parallel compared to systems in which each modulator is equipped with a separate lens for the Fourier transformation. In addition, multiple modulator receivers can be employed, for example, for the Fourier transformation of the multi-dimensional signals or for the simultaneously frequency analysis of the plurality of high frequency bands.

Although various minor modifications may be suggested by those versed in the art, it should be understood that we wish to embody within the scope of the patent granted hereon, all such modifications as reasonably and properly come within the scope of our contribution to the art.

We claim:

1. An acousto-optical frequency analyzer constructed to minimize manufacturing cost wherein the analyzer includes a first part comprising a first substrate of a first material, a first waveguide of the first substrate, and a means for modulating light traveling in the first waveguide; a second part comprising a second substrate of a second material, a second waveguide on the second substrate, a geodesic lens being formed in said second substrate and the second material being a material selected from the group consisting of glass and synthetic plastics; and the first and second parts being optically coupled with light passing from the first waveguide into the second waveguide.

2. A frequency analyzer according to claim 1 wherein the first material consists of $LiNbO_3$.

3. A frequency analyzer according to claim 1 wherein said first and second parts are connected to one another by a butt joint.

4. A frequency analyzer according to claim 3, wherein an anti-reflection layer is positioned between the butt coupled parts.

5. A frequency analyzer according to claim 1, which includes a third substrate of a material different from the material of the first substrate, said third substrate having a geodesic lens to form a collimation lens for the analyzer.

6. A frequency analyzer according to claim 1, wherein the second substrate consists of a material in which the lens can be produced in a hot pressing method.

7. An acousto-optical frequency analyzer constructed to minimize manufacturing costs wherein the analyzer includes at least two first parts, each first part comprising a first substrate of a first material, a first waveguide on the first substrate, and means for modulating light traveling in the first waveguide; a second part comprising a second substrate of a second material, said second material being a material selected from a group consisting of glass and synthetic plastics, a second waveguide on the second substrate and a geodesic lens being formed in the second waveguide; and each of the first parts being optically coupled to the second part with the first waveguide being optically coupled to the second waveguide so that the geodesic lens is a common geodesic lens for light traveling in each of the first waveguides.

8. A frequency analyzer according to claim 7, wherein the second substrate of the second part has a polygonal shape, each of said first parts being coupled in abutting relation to a separate side and a detector array for each first part being disposed on a side of the second substrate opposite the side having the first part.

9. A frequency analyzer according to claim 8, wherein said second substrate of the second part has an even number of sides.

10. A frequency analyzer according to claim 9, wherein the second substrate has six sides.

11. A frequency analyzer according to claim 9, wherein the first parts are attached to adjacent sides of the polygonal-shaped second part.

12. A frequency analyzer according to claim 9, wherein each first part is attached to a side of the second part having an adjacent side provided with a detector array.

13. A method for producing a frequency analyzer for planar waveguide technology have a planar waveguide modulator from modulating light disposed on one substrate connected to a second substrate having a geodesic lens for creating a Fourier transformation of the light modulated by said modulator, said method providing a substrate, forming a waveguide on the surface of said substrate, forming a planar waveguide modulator on said waveguide to form the substrate having a waveguide modulator, providing at least a second substrate of a material different than the material of the first mentioned substrate, forming a waveguide on the surface thereof, and pressing a die into the surface of said waveguide to form the geodesic lens, then abutting said substrates together to complete the analyzer.

14. A method according to claim 13, wherein the step of pressing a die into the surface of the second waveguide to form the geodesic lens comprises hot pressing.

15. A method according to claim 13, wherein the material of the second substrate comprises a material selected from a group consisting of glass and synthetic plastics.

* * * * *